(12) United States Patent  
Rigby

(10) Patent No.: US 7,751,638 B1  
(45) Date of Patent: Jul. 6, 2010

(54) ADAPTIVE QUANTIZER

(75) Inventor: Lawrence Rigby, Guildford (GB)

(73) Assignee: Altera Corporation, San Jose, CA (US)

( * ) Notice: Subject to any disclaimer, the term of this patent is extended or adjusted under 35 U.S.C. 154(b) by 962 days.

(21) Appl. No.: 11/521,868

(22) Filed: Sep. 15, 2006

(51) Int. Cl.
- *G06K 9/36* (2006.01)
- *G06K 9/46* (2006.01)
- *G06K 9/68* (2006.01)

(52) U.S. Cl. ...................... 382/251; 382/239

(58) Field of Classification Search .............. 382/164, 382/172, 173, 218–220, 232, 233, 239, 250, 382/251, 270; 375/216, 240.15, 240.23, 375/245, E7.245; 341/51, 76; 358/426.14, 358/466; 704/229, 500

See application file for complete search history.

(56) References Cited

U.S. PATENT DOCUMENTS

| | | | | |
|---|---|---|---|---|
| 4,437,087 A * | 3/1984 | Petr | ............................. | 341/51 |
| 4,571,737 A * | 2/1986 | Nishitani et al. | ............. | 375/245 |
| 4,677,423 A * | 6/1987 | Benvenuto et al. | ............. | 341/51 |
| 4,785,349 A * | 11/1988 | Keith et al. | ............ | 375/240.23 |
| 4,868,653 A * | 9/1989 | Golin et al. | ............ | 375/240.23 |
| 5,185,800 A * | 2/1993 | Mahieux | ...................... | 704/500 |
| 5,263,088 A * | 11/1993 | Hazu et al. | .................. | 704/229 |
| 5,301,242 A * | 4/1994 | Gonzales et al. | ............ | 382/239 |
| 5,438,633 A * | 8/1995 | Ghaderi | ....................... | 382/270 |
| 5,963,673 A * | 10/1999 | Kodama et al. | ............. | 382/239 |
| 6,782,135 B1 * | 8/2004 | Viscito et al. | ............... | 382/239 |
| 7,299,190 B2 * | 11/2007 | Thumpudi et al. | .......... | 704/500 |

OTHER PUBLICATIONS

Yaghoobi, Hassan; "Scalable OFDMA Physical Layer in IEEE 802.16 WirelessMAN"; 2004, *Intel Technology Journal*, vol. 8, No. 3, pp. 201-212.

"Air Interface for Fixed Broadband Wireless Access Systems"; 2004, *IEEE Std*, vol. 802, pp. 427-568.

"OFDM or OFDMA?"; 2005, *RFDDESIGN*, 2 pages.

* cited by examiner

*Primary Examiner*—Amir Alavi  
(74) *Attorney, Agent, or Firm*—Townsend and Townsend and Crew, LLP

(57) ABSTRACT

A quantizer can be used to adjust the number of bits representing each sample value in a signal. Then, each received sample is allocated to one of a number of bins, with each bin corresponding to one of the possible quantizer output values. The quantizer can be used for providing a digital signal with a required number of bits, and the quantization interval can be adjusted. The quantization is performed in multiple stages. In a first stage, a received signal is compared with a first threshold value. In subsequent stages, the received signal is compared with respective threshold values, with the threshold value for each stage being calculated on the basis of the comparison result of the previous stage, and on the basis of an adjustable quantization interval. The quantized value is formed from the one-bit results from the comparison operations.

20 Claims, 3 Drawing Sheets

ADAPTIVE QUANTIZER

BACKGROUND OF THE INVENTION

This invention relates to a quantizer that can be used for providing a digital signal with a required number of bits. More specifically, the invention relates to a quantizer in which the quantisation interval can be adjusted.

In many cases, where digital signals are being processed in an electronic device, a digital signal is received with a certain number of bits representing each value of the signal. For example, in a wireless communications device, an analog signal is received, and this is converted to a digital signal by means of an analog-digital converter. The precision of the analog-digital converter determines how many bits represent each sample value. For example, each sample value may be represented by a 16 bit value.

Other signal processing blocks may work best with sample values being represented by particular numbers of bits. Where the number of bits in each initial sample value differs from the number of bits required per sample value for further processing of the received signal, it is necessary to use a quantizer to adjust the number of bits representing each sample value. Then, each received sample is allocated to one of a number of bins, with each bin corresponding to one of the possible quantizer output values.

In making this adjustment, one issue that must be considered is the dynamic range of the high resolution sample values. Where the signals received by the quantizer occupy a large proportion of the range of possible values, that is, the sample values have a large dynamic range, then each bin must be relatively wide, in order to ensure that the quantizer output values can properly distinguish between different sample values. Where the signals received by the quantizer occupy a smaller proportion of the range of possible values, each bin must be relatively narrow, in order to ensure that the quantizer output values can property distinguish between different sample values.

SUMMARY OF THE INVENTION

According to an aspect of the present invention, there is provided a quantizer, in which the quantization interval can be adjusted.

According to an embodiment of the invention, there is provided a quantizer, in which the quantization is performed in multiple stages. In a first stage, a received signal is compared with a first threshold value. In subsequent stages, the received signal is compared with respective threshold values, with the threshold value for each stage being calculated on the basis of the comparison result of the previous stage, and on the basis of an adjustable quantization interval. The quantizer output is formed from the one-bit results of the comparisons in the multiple stages.

According to another aspect of the invention, there is provided computer-readable code, for causing a programmable logic device to implement the quantizer of the invention.

According to a further aspect of the invention, there is provided a signal processing device, in which a quantizer is used to adjust the number of bits representing each sample value.

According to a still further aspect of the invention, there is provided a divider circuit, in which the division is performed in multiple stages. In a first stage, a numerator is compared with a first threshold value. In subsequent stages, the numerator is compared with respective threshold values, with the threshold value for each stage being calculated on the basis of the comparison result of the previous stage, and on the basis of a denominator value. The division result is formed from the one-bit results of the comparisons in the multiple stages.

DETAILED DESCRIPTION OF EMBODIMENTS

Figure 1:
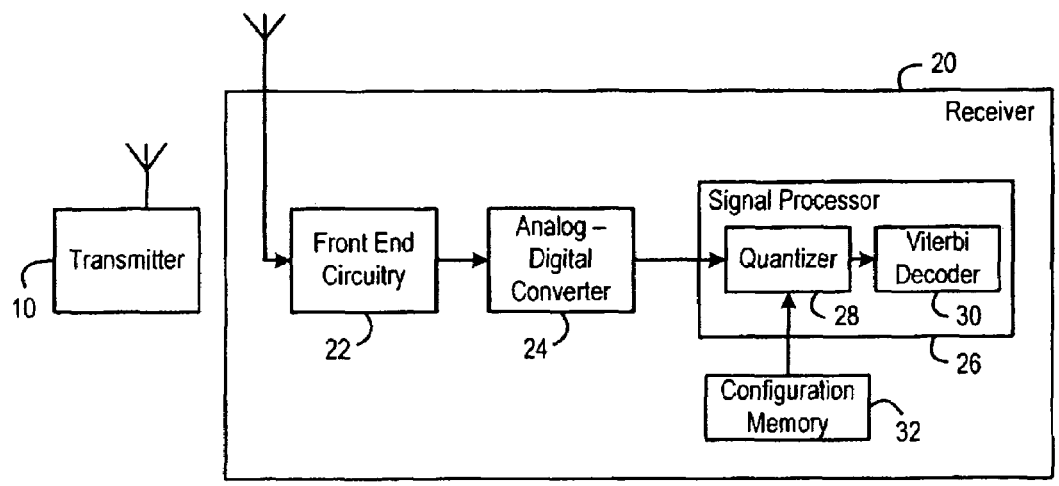
FIG. 1 is a block schematic diagram of a wireless communications system, including a signal processing device in accordance with an aspect of the invention.

FIG. 1 is a block schematic diagram of a wireless communications system. As is conventional, the system includes a transmitter 10 and a receiver 20, and the transmitter 10 sends radio frequency signals to the receiver 20. The signals can be transmitted in accordance with any wireless communications protocol.

The receiver includes radio frequency front end circuitry 22, for example for converting the radio frequency signals down to a low frequency, at which the information content can more easily be recovered. The received signal is then passed to an analog-digital converter 24, in which it is converted into a digital form. That is, a sample period is defined, for example by the frequency of a clock signal, and, once in every sample period, the analog value of the received signal is converted into a digital form. In one embodiment of the invention, the digital signal is a 16 bit digital signal. Thus, during every sample period, the analog value of the received signal is represented by a digital signal, and that digital signal can take one of $2^{16}$, that is 65,536, possible values.

The digital signal values are then passed to a signal processor 26, where the digital signals are processed, in order to recover the transmitted information. One well known information processing technique involves a so-called soft decision constellation demapper and Viterbi decoder. When the signal is transmitted, additional data is included in the data symbols, in order to allow error correction in the receiver 20. Viterbi decoding involves determining which of the possible transmitted symbols is the most likely to have been transmitted, based on the output from the soft decision demapper. Viterbi decoding requires a relatively large number of computations to be performed on the received digital signals, and the resources required to perform these computations are strongly dependent on the number of bits representing each sample value.

It has been found that, at least in some wireless communications systems, while the resources required to perform the computations in the decoder are strongly dependent on the number of bits representing each sample value, the accuracy of the decoding does not improve greatly when the number of bits representing each sample value increases beyond about six.

Therefore, in order to improve the efficiency of the decoding, the received 16-bit digital signal is passed to a quantizer 28 in order to form a 6-bit digital signal, which can then be used in the further decoding steps. FIG. 1 shows the 6-bit digital signal being passed to a Viterbi decoder 30, although it will be clear that this is just one example of the form of signal processing that can be performed.

In an embodiment of the invention, some or all of the signal processor 26 is implemented in a Field Programmable Gate Array (FPGA) or other Programmable Logic Device (PLD). As is known, such devices include logic elements, whose interconnections and functions are determined by configuration data applied to the device. The configuration data can be applied to the device as required, so that the function of the device can be changed. As shown in FIG. 1, the configuration data is stored in a configuration memory 32, from which it can be applied to the quantizer 28, in order to change the operation of the quantizer 28. As will be known to the person skilled in the art, tools exist to allow a designer to generate from the required design (as described in more detail below) the configuration data required to instantiate the design in a Field Programmable Gate Array.

Figure 2:
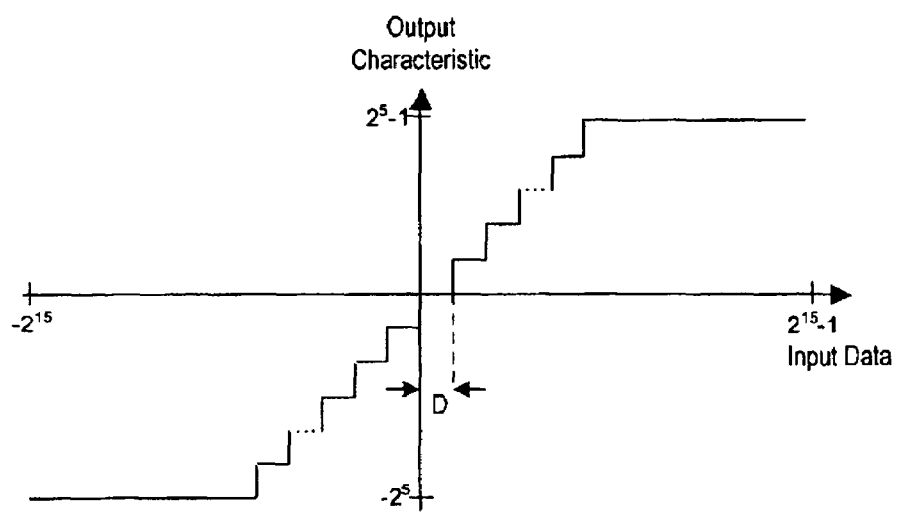
FIG. 2 illustrates the operation of a quantizer in accordance with an aspect of the invention.

FIG. 2 illustrates the operation of the quantizer 28. As shown in FIG. 2, the input data value of the 16-bit input digital signal can lie anywhere in the range from $-2^{15}$ to $+2^{15}-1$, operating with the convention that the value of the most significant bit indicates the sign of the data value. Then, the output data value of the 6-bit output digital signal can lie anywhere in the range from $-2^5$ to $+2^5-1$, again operating with the same convention that the value of the most significant bit indicates the sign of the data value.

FIG. 2 also illustrates the quantization interval, D. Thus, input data values of the 16-bit input digital signal in the range from 0 to D correspond to an output data value of 0; input data values of the 16-bit input digital signal in the range from D to 2D correspond to an output data value of 1; input data values of the 16-bit input digital signal in the range from 2D to 3D correspond to an output data value of 2, and so on.

In effect, each input data value is classified into one of the discrete bins, whose width corresponds to the quantization interval, D. The maximum and minimum bins, having the output data values of $-2^5$ and $+2^5-1$, contain all the inputs that have larger magnitudes than the inputs allocated to the adjacent bins.

In a preferred embodiment of the invention, the quantization interval is not known while the device is being manufactured, and can be changed during the operation of the quantizer. This allows the quantization interval to be changed to take account of changes in the properties of the received signal. Moreover, the quantization interval may be able to take any value, without for example being limited to values that are equal to powers of 2.

It has been found, at least for some wireless communication systems, that in some situations the relationship between the dynamic range of the signal and the quantization interval will be such that many of the 16 bit samples must be saturated into the maximum and minimum bins. This saturation is also achieved as an aspect of the invention, as will be apparent from the following description.

Figure 3:
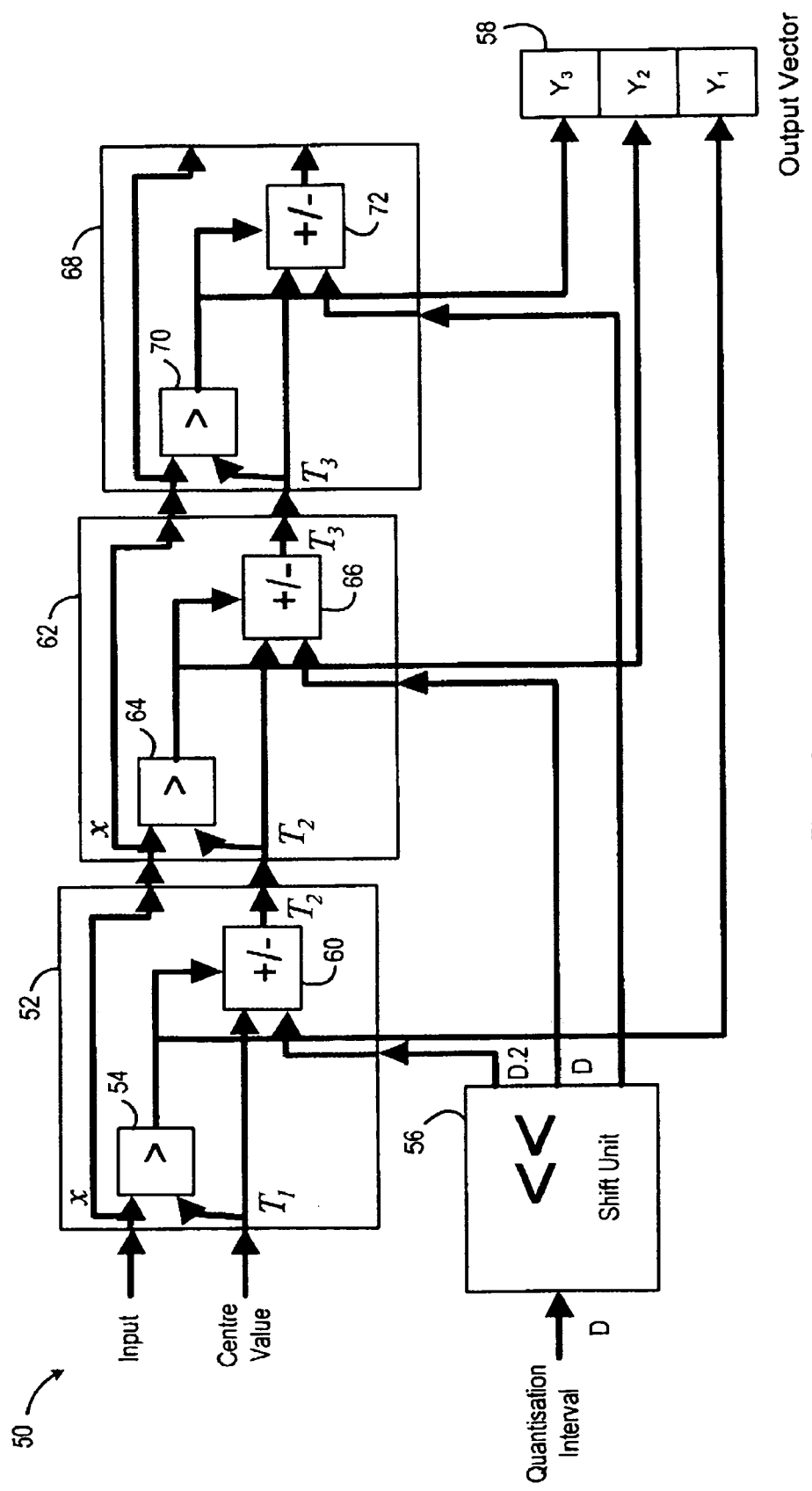
FIG. 3 illustrates a method of operation of one particular configuration of a quantizer in accordance with an aspect of the invention.

FIG. 3 is a block schematic diagram, illustrating a quantizer 50 in accordance with an aspect of the invention. In this illustrated example, the quantizer 50 is a three stage quantizer, and therefore produces a 3-bit output digital signal, in contrast to the 6-bit output digital signal mentioned above. As will be discussed in more detail below, the quantizer is modular. That is, each stage of the quantizer is effectively the same, and each stage produces one output bit, and so it is simple to produce any desired size of quantizer, based on the example in FIG. 3.

In the case of the quantizer 50 shown in FIG. 3, an input signal x is applied to a first stage block 52. Specifically, the input signal x is applied to a first input of a comparator 54. A centre value is used to form a first threshold value $T_1$, and this is applied to a second input of the comparator 54. Where the numerical convention described above is being used, namely that the value of the most significant bit indicates the sign of the data value, then the centre value used to form the first threshold value $T_1$, may advantageously be zero, although it can in principle take any value.

The result of the comparison (namely a "1" if the input signal x is greater than the first threshold value $T_1$, and a "0" if the input signal x is not greater than the first threshold value $T_1$) is taken as the first (most significant) bit $Y_1$ of an output value 58.

The first threshold value $T_1$ is also applied to a first input of an adder/subtractor 60.

A value for the quantization interval is applied to a shift unit 56, and an output first increment value, equal to the quantization interval left-shifted once, is applied to a second input of the adder/subtractor 60. Generally, where the quantizer 50 has a number of stages P, then the first increment value is formed by left-shifting the quantization interval (P−2) times.

If the input signal x is greater than the first threshold value $T_1$, then the first increment value is added to the first threshold value $T_1$ in the adder/subtractor 60 to form a second threshold value $T_2$. If the input signal x is not greater than the first threshold value $T_1$, then the first increment value is subtracted from the first threshold value $T_1$ in the adder/subtractor 60 to form the second threshold value $T_2$. This second threshold value $T_2$ is then passed on to a second stage block 62.

The operation of the second stage block 62 is the same as that of the first stage block 52. Specifically, the input signal x is applied to a first input of a comparator 64. The second threshold value $T_2$ is applied to a second input of the comparator 64.

The result of the comparison (namely a "1" if the input signal x is greater than the second threshold value $T_2$, and a "0" if the input signal x is not greater than the second threshold value $T_2$) is taken as the second most significant bit $Y_2$ of the output value 58.

The second threshold value $T_2$ is also applied to a first input of an adder/subtractor 66.

The shift unit 56 provides an output second increment value, equal to the quantization interval, and this is applied to a second input of the adder/subtractor 66. Generally, where the quantizer 50 has a number of stages P, then the second increment value is formed by left-shifting the quantization interval (P−3) times.

If the input signal x is greater than the second threshold value $T_2$, then the second increment value is added to the second threshold value $T_2$ in the adder/subtractor 66 to form a third threshold value $T_3$. If the input signal x is not greater than the second threshold value $T_2$, then the second increment value is subtracted from the second threshold value $T_2$ in the adder/subtractor 66 to form the third threshold value $T_3$.

Depending on the number of bits required in the output value, then the corresponding number of stages can be provided in the quantizer 50. The operation of the final stage block, namely in this case the third stage block 68 is slightly different from that of the first stage block 52 and the second stage block 62, in that it is not necessary to generate a new threshold value for use by a subsequent stage.

However, the input signal x is applied to a first input of a comparator 70. The third threshold value $T_3$ is applied to a second input of the comparator 70.

The result of the comparison (namely a "1" if the input signal x is greater than the third threshold value $T_3$, and a "0" if the input signal x is not greater than the third threshold value $T_3$) is taken as the third most significant bit (that is, the least significant bit) $Y_3$ of the output value 58.

Although the third stage block 68 includes adder/subtractor 72, and this is connected to receive inputs from the adder/subtractor 66 of the second stage block 62 and from the shift unit 56, this is only so that the third stage block 68 can replicate the first stage block 52 and the second stage block 62 so that the design can be replicated.

Thus, at each stage, a new threshold is calculated, and a bit of the output value is determined by comparing the input value with that newly calculated threshold. The quantization therefore proceeds on a "divide-and-conquer" basis.

A new threshold $T_{n+1}$ is calculated at the nth stage according to:

$$T_{n+1} = T_n + c(D \cdot 2^\tau)$$

where:

$$c = \begin{cases} 1, & x > T_n \\ -1, & x \leq T_n \end{cases}$$

D is the quantization interval, and $\tau = P - (n+1)$, where x is the input value, and P is the number of bits in the output value.

Also, the nth bit of the output value is calculated at the nth stage according to:

$$Y_n = \begin{cases} 1, & c = 1 \\ 0, & c = -1 \end{cases}$$

Figure 4:
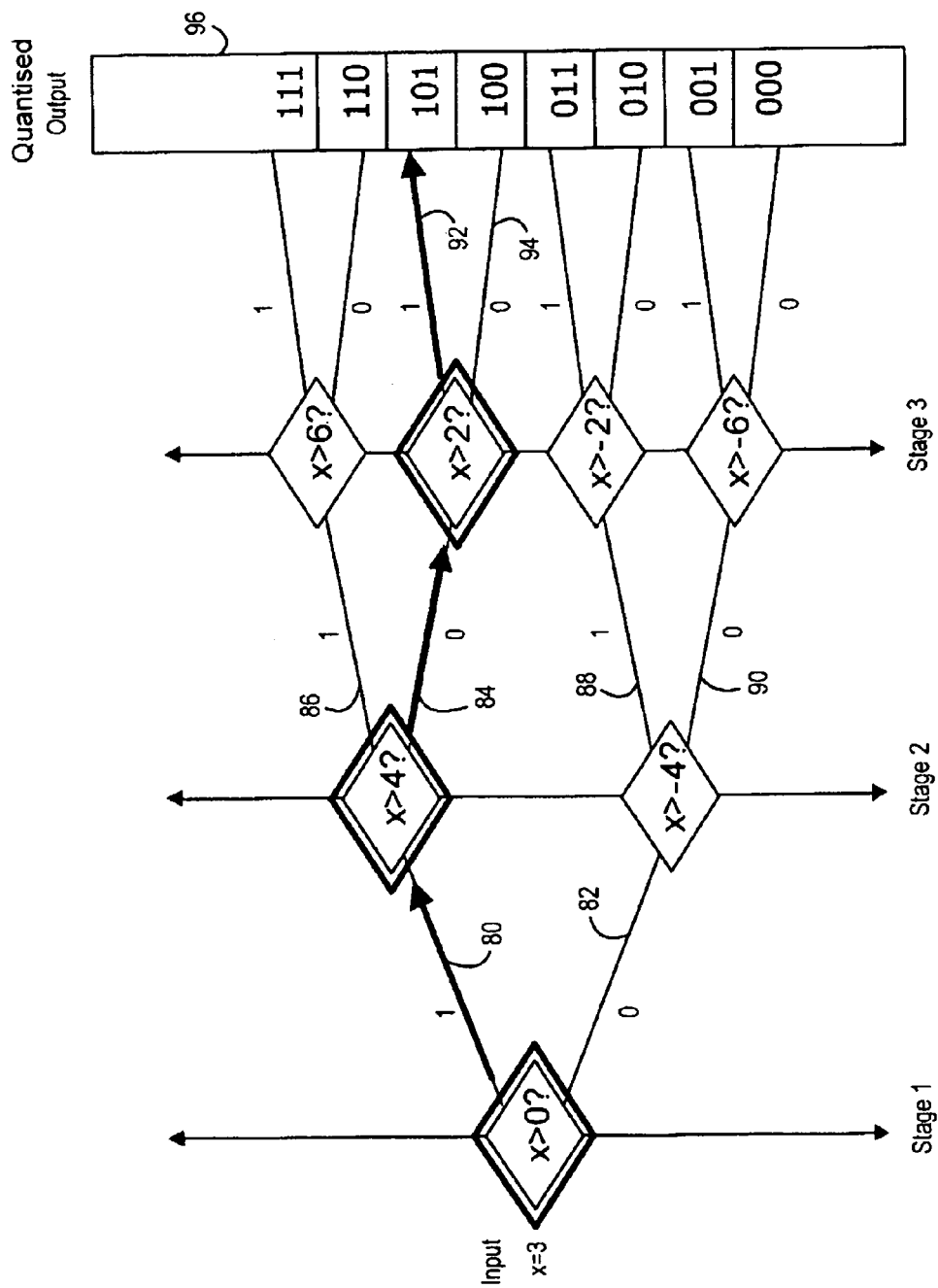
FIG. 4 is a diagram illustrating the functionality of the quantizer in accordance with an aspect of the invention.

To illustrate this more clearly, FIG. 4 illustrates the operation of the quantizer 50 of FIG. 3, for specific numerical values.

In this illustrated example, there are three stages in the quantizer, which therefore produces a 3 bit output value; the input value, x, is equal to 3; the quantization interval, D, is set to 2; and the first threshold value $T_1$ is equal to 0.

Thus, at the first stage, the input value, 3, is compared with the first threshold value 0. As the input value is greater than the first threshold value, an output "1" is generated, as shown by the bold line 80, and the second threshold value is calculated by adding the first increment value, 4, to the first threshold value, 0. If the input value had not been greater than the first threshold value, then an output "0" would have been generated, as shown by the line 82, and the second threshold value would have been calculated by subtracting the first increment value, 4, from the first threshold value, 0.

At the second stage, the input value, 3, is compared with the second threshold value, 4. As the input value is not greater than the second threshold value, an output "0" is generated, as shown by the bold line 84, and the third threshold value is calculated by subtracting the second increment value, 2, from the second threshold value, 4. If the input value had been greater than the second threshold value, then an output "1" would have been generated, as shown by the line 86, and the third threshold value would have been calculated by adding the second increment value, 2, to the second threshold value, 4.

If the input value had not been greater than the first threshold value, then, as mentioned above, the second threshold value would have been calculated by subtracting the first increment value, 4, from the first threshold value, 0. Further, the third threshold value would have been calculated by adding the second increment value, 2, to the second threshold value, −4, as shown by the line 88, or by subtracting the second increment value, 2, from the second threshold value, −4, as shown by the line 90, depending on the result of the comparison with the second threshold value.

At the third stage, the input value, 3, is compared with the third threshold value, 2. As the input value is greater than the third threshold value, an output "1" is generated, as shown by the bold line 92. In this case, as there are no subsequent stages, no further second threshold value is calculated. If the input value had not been greater than the first threshold value, then an output "0" would have been generated, as shown by the line 94.

If the results of the previous comparisons had been different, then the input value would be compared at the third stage with a differently calculated third threshold value, as also shown in FIG. 3.

The resulting sequence of bits generated as a result of the three comparisons is then provided as a quantized output 96. It will be noted that, if the input value is greater than all of the threshold values, a saturated maximum output, 111, is formed and, conversely, if the input value is less than all of the threshold values, a saturated minimum output, 000, is formed.

There is thus provided a circuit for quantizing an input signal with a desired, variable, quantization interval. Moreover, the number of calculation blocks can also be varied, if desired, in order to vary the precision of the output. That is, if a number of calculation blocks is provided, corresponding to a predetermined maximum precision, then the number of such blocks that is actually in use at any one time can be varied.

Although the circuit can be implemented efficiently in an FPGA, it will be apparent that the same circuit can equally be implemented in any type of device.

Although the illustrated embodiment shows three calculation blocks 52, 62, 68 being provided, with one for each stage, it is also possible to provide a number of calculation blocks that is smaller than the number of stages, provided that means are also provided for storing the relevant thresholds.

Further, while FIG. 3 shows the use of a shift unit 56 to generate the first and second increment values from the quantization interval, D, these can be generated in other ways. The effect of using a shift unit as described is that each increment value is higher by a factor of 2 than the subsequent increment value. This has the result that, with the exception of the maximum and minimum bins, the discrete bins, into which each input data value is classified, all have equal widths, namely the quantization interval, D. However, in cases where the widths of the discrete bins are desired to have some other property, this can be achieved by suitable modification of the shift unit 56 to calculate the increment values.

The invention has been described herein with reference to its use as a quantizer. However, the same circuit can also be used with some modification as a divider, for forming a coarse division result. That is, if the numerator is applied as the input value, and the denominator is set as the quantization interval, then, by modifying the comparators 54, 64, 70 so that they produce a positive output if the input is greater than or equal to the relevant threshold value, and by inverting the most significant bit of the output, the output value Y is:

$$Y = \text{floor}\left(\frac{\text{numerator}}{\text{denominator}}\right)$$

the floor function being defined as the result of rounding down the result towards minus infinity (−∞).

There are thus provided a method and a device for quantizing a received signal, or for performing an arithmetic division where the input represents a specific number.

The invention claimed is:

1. A quantizer, comprising a plurality of calculation blocks, wherein at least one of the calculation blocks comprises:
   a comparator, for comparing an input value with a respective threshold value;
   a threshold calculator, for forming a new respective threshold value from the respective threshold value and a respective increment value, based on a result of the comparison of the input value with the respective threshold value, such that the new respective threshold value is used as the respective threshold value in a subsequent calculation block; and
   an output, for providing an output bit based on the result of the comparison of the input value with the respective threshold value,
   and wherein a final calculation block comprises:
   a comparator, for comparing the input value with a respective threshold value; and
   an output, for providing an output bit based on the result of the comparison of the input value with the respective threshold value,
   the quantizer further comprising an increment calculation block, for forming the respective increment value.

2. The quantizer of claim 1, wherein the increment calculation block receives a quantization interval value as an input thereto.

3. The quantizer of claim 2, wherein the increment calculation block comprises a shift unit, and forms the respective increment value by left-shifting the quantization interval value by a respective number of bit positions.

4. The quantizer of claim 1, wherein the threshold calculator forms the new respective threshold value by adding the respective increment value to the respective threshold value if the input value is greater than the respective threshold value, and by subtracting the respective increment value from the respective threshold value if the input value is not greater than the respective threshold value.

5. A computer-readable medium, comprising computer-readable code, for causing a programmable logic device to implement a quantizer comprising a plurality of calculation blocks, wherein at least one of the calculation blocks comprises:
   a comparator, for comparing an input value with a respective threshold value;
   a threshold calculator, for forming a new respective threshold value from the respective threshold value and a respective increment value, based on a result of the comparison of the input value with the respective threshold value, such that the new respective threshold value is used as the respective threshold value in a subsequent calculation block; and
   an output, for providing an output bit based on the result of the comparison of the input value with the respective threshold value,
   and wherein a final calculation block comprises:
   a comparator, for comparing the input value with a respective threshold value; and
   an output, for providing an output bit based on the result of the comparison of the input value with the respective threshold value,
   the quantizer further comprising an increment calculation block, for forming the respective increment value.

6. The computer-readable medium of claim 5, wherein the increment calculation block receives a quantization interval value as an input thereto.

7. The computer-readable medium of claim 6, wherein the increment calculation block comprises a shift unit, and forms the respective increment value by left-shifting the quantization interval value by a respective number of bit positions.

8. The computer-readable medium of claim 5, wherein the threshold calculator forms the new respective threshold value by adding the respective increment value to the respective threshold value if the input value is greater than the respective threshold value, and by subtracting the respective increment value from the respective threshold value if the input value is not greater than the respective threshold value.

9. A signal processing device, comprising an input, for receiving a signal in which each sample is represented by a first number of bits, a quantizer, and an output for providing a signal in which each sample is represented by a second number of bits, wherein the first number of bits is greater than the second number of bits, and wherein the quantizer, comprises a plurality of calculation blocks, wherein at least one of the calculation blocks comprises:
   a comparator, for comparing an input value with a respective threshold value;
   a threshold calculator, for forming a new respective threshold value from the respective threshold value and a respective increment value, based on a result of the comparison of the input value with the respective threshold value, such that the new respective threshold value is used as the respective threshold value in a subsequent calculation block; and
   an output, for providing an output bit based on the result of the comparison of the input value with the respective threshold value,
   and wherein a final calculation block comprises:
   a comparator, for comparing the input value with a respective threshold value; and
   an output, for providing an output bit based on the result of the comparison of the input value with the respective threshold value,
   the quantizer further comprising an increment calculation block, for forming the respective increment value.

10. The signal processing device of claim 9, further comprising a Viterbi decoder, for receiving the signal from the output.

11. The signal processing device of claim 10, wherein the second number of bits is six.

12. The signal processing device of claim 10, wherein the first number of bits is sixteen.

13. The signal processing device of claim 9, wherein the increment calculation block receives a quantization interval value as an input thereto.

14. The signal processing device of claim 13, wherein the increment calculation block comprises a shift unit, and forms the respective increment value by left-shifting the quantization interval value by a respective number of bit positions.

15. The signal processing device of claim 9, wherein the threshold calculator forms the new respective threshold value by adding the respective increment value to the respective threshold value if the input value is greater than the respective threshold value, and by subtracting the respective increment value from the respective threshold value if the input value is not greater than the respective threshold value.

16. A divider circuit, comprising a plurality of calculation blocks, wherein at least one of the calculation blocks comprises:
- a comparator, for comparing a numerator value with a respective threshold value;
- a threshold calculator, for forming a new respective threshold value from the respective threshold value and a respective increment value, based on a result of the comparison of the numerator value with the respective threshold value, such that the new respective threshold value is used as the respective threshold value in a subsequent calculation block; and
- an output, for providing an output bit based on the result of the comparison of the numerator value with the respective threshold value, and wherein a final calculation block comprises:
- a comparator, for comparing the numerator value with a respective threshold value; and
- an output, for providing an output bit based on the result of the comparison of the input value with the respective threshold value,
- the divider circuit further comprising an increment calculation block, for forming the respective increment value by left-shifting a denominator value by a respective number of bit positions.

17. A method of quantizing an input signal, the method comprising:
using a quantizer to:
in at least one calculation block:
- comparing the input signal with a respective threshold value;
- forming a new respective threshold value from the respective threshold value and a respective increment value, based on a result of the comparison of the input signal with the respective threshold value, such that the new respective threshold value is used as the respective threshold value in a subsequent calculation block; and
- providing an output bit based on the result of the comparison of the input signal with the respective threshold value, and in a final calculation block:
- comparing the input signal with a respective threshold value; and
- providing an output bit based on the result of the comparison of the input signal with the respective threshold value, and the method further comprising forming the respective increment value based on a specified quantization interval.

18. The method of claim 17, further comprising receiving a quantization interval value as an input to the increment calculation block.

19. The method of claim 18, further comprising forming the respective increment value by left-shifting the quantization interval value a respective number of bit positions.

20. The method of claim 17, further comprising forming the new respective threshold value by adding the respective increment value to the respective threshold value if the input value is greater than the respective threshold value, and by subtracting the respective increment value from the respective threshold value if the input value is not greater than the respective threshold value.

* * * * *